(12) United States Patent
Lee et al.

(10) Patent No.: US 8,691,620 B2
(45) Date of Patent: Apr. 8, 2014

(54) METHOD FOR PREPARATION OF FRONT ELECTRODE FOR SOLAR CELL OF HIGH EFFICIENCY

(75) Inventors: Dongwook Lee, Daejeon (KR); Inseok Hwang, Daejeon (KR); Seokhyun Yoon, Daejeon (KR); Sangki Chun, Daejeon (KR); Jiyoung Hwang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 33 days.

(21) Appl. No.: 13/322,484

(22) PCT Filed: May 26, 2010

(86) PCT No.: PCT/KR2010/003303
§ 371 (c)(1),
(2), (4) Date: Feb. 21, 2012

(87) PCT Pub. No.: WO2010/137854
PCT Pub. Date: Dec. 2, 2010

(65) Prior Publication Data
US 2012/0132273 A1    May 31, 2012

(30) Foreign Application Priority Data
May 26, 2009   (KR) .................. 10-2009-0046118

(51) Int. Cl.
*H01L 31/0224*   (2006.01)
*H01L 31/18*   (2006.01)

(52) U.S. Cl.
USPC .................................... 438/98; 257/E31.124

(58) Field of Classification Search
None
See application file for complete search history.

(56) References Cited

U.S. PATENT DOCUMENTS

2007/0186968 A1*   8/2007   Nakauchi et al. ............. 136/244
2012/0147303 A1*   6/2012   Yamada et al. ................. 349/96

FOREIGN PATENT DOCUMENTS

| CN | 101009336 A | 8/2007 |
| CN | 101043078 A | 9/2007 |
| JP | 2007-158302 A | 6/2007 |
| KR | 10-2006-0065009 A | 6/2006 |
| KR | 10-2008-0050862 A | 6/2008 |
| KR | 10-2008-0064545 A | 7/2008 |

OTHER PUBLICATIONS

International Search Report for International Application No. PCT/KR2010/003303, mailed on Jan. 4, 2011.

* cited by examiner

*Primary Examiner* — Seahvosh Nikmanesh
(74) *Attorney, Agent, or Firm* — Birch, Stewart, Kolasch & Birch, LLP

(57) ABSTRACT

Disclosed is a method for manufacturing a front electrode for solar cells including: filling a paste for forming electrodes in a mold in which a depression pattern corresponding to a pattern of a front electrode is imprinted, drying the paste and bringing an adhesive film in contact with the paste to transfer the paste from the mold, adding the adhesive film to the semiconductor substrate such that the paste is directed toward a semiconductor substrate, and baking the paste transferred from the adhesive film to form a front electrode on the semiconductor substrate.

10 Claims, 7 Drawing Sheets

601

602

METHOD FOR PREPARATION OF FRONT ELECTRODE FOR SOLAR CELL OF HIGH EFFICIENCY

TECHNICAL FIELD

The present invention relates to a method for manufacturing a front electrode for solar cells. More specifically, the present invention relates to a method for manufacturing a front electrode for solar cells including filling a paste for forming an electrode in a mold in which a depression pattern corresponding to a pattern of a front electrode is imprinted, drying the paste, bringing an adhesive film into contact with the paste to transfer the paste from the mold, adding the adhesive film to the semiconductor substrate such that the paste is directed toward a semiconductor substrate, and baking the paste transferred from the adhesive film to form a front electrode on the semiconductor substrate.

BACKGROUND ART

Recent increased concern associated with environmental problems and energy depletion has brought about an increased interest in solar cells as alternative energies which are abundant in energy sources, are free of environmental contamination and provide high energy efficiency.

Solar cells are classified into solar heat cells to generate vapor required for rotation of turbines using solar heat and solar light cells which convert sunlight (photons) into electric energy using semiconductor characteristics. Of these, solar light cells which convert light energy into electric energy absorb light to produce electrons and holes are actively researched.

Such a solar light cell (hereinafter, simply referred to a "solar cell") is schematically illustrated in FIG. 1. Referring to FIG. 1, the solar cell includes a first conductive semiconductor layer 22, a second conductive semiconductor layer 23 having an opposite conductive type to the first conductive semiconductor layer 22 arranged thereon, a P/N junction formed between the first and second conductive semiconductors, a rear electrode 21 which contacts at least a part of the first conductive semiconductor layer 22, and a front electrode 11 which contacts at least a part of the second conductive semiconductor layer 23. In some cases, the solar cell may further include an anti-reflection film 24 arranged on the second conductive semiconductor layer 23.

The first conductive semiconductor layer 22 is generally a p-type silicon substrate and the second conductive semiconductor layer 23 is generally an n-type emitter layer. In addition, the front electrode 11 is formed with an Ag pattern on the emitter layer 23, and the rear electrode 21 is formed with an Al layer on the rear surface of the silicon substrate 22. The formation of the front electrode 11 and the rear electrode 21 is generally carried out by a screen printing method. The front electrode is generally composed of two current-collecting electrodes having a large width (also called a "bus bar") and a grid electrode (also called a "finger") having a small width of about 150 μm.

In such a solar cell having this configuration, when sunlight is incident upon the front electrode 11, free electrons are generated and move toward the n-type semiconductor layer 23 based on the principle of the PN junction and this flow of electrons forms a current.

As such, performance of solar cells which directly convert light energy into electric energy is represented by a ratio of electric energy emitted from the solar cells to incident solar energy. This ratio is an indicator of performance of solar cells and is commonly referred to as "energy conversion efficiency", or simply "conversion efficiency". The theoretical limit of conversion efficiency depends on constituent components of solar cells and is controlled by the spectrum of sunlight and sensitivity spectrum of the solar cell. For example, monocrystalline silicon solar cells have a conversion efficiency of about 30 to 35%, amorphous silicon solar cells have a conversion efficiency of 25% and compound semiconductors have a conversion efficiency of 20 to 40%. However, actual efficiency of solar cells is currently about 25% on a laboratory scale.

The reasons behind this may be loss of surface-reflective light, loss of carriers by recombination on the surface or interface of electrodes, loss of carriers through recombination in photocells and loss by internal resistance of solar cells.

Of these reasons, power loss by electrodes include resistance loss caused by movement of photocurrent on the n-type semiconductor layer, loss by contact resistance between the n-type semiconductor layer and the grid electrode, resistance loss by photocurrent which moves along the grid electrode, and loss by regions shielded by the grid electrode.

However, some factors associated with power loss are contrary to one another. For example, resistance loss is inversely proportional to the thickness of a grid electrode, but loss of the amount of incident light (the amount of absorbed light) is directly proportional to the size of the grid. Accordingly, when the size of the grid electrode is increased in order to minimize resistance loss, loss of incident light disadvantageously increases.

Accordingly, there is an increasing need for methods which minimize power loss by electrodes and maximize light absorbance amount in order to realize high-efficiency solar cells.

DISCLOSURE

Technical Problem

Therefore, the present invention has been made to solve the above problems and other technical problems that have yet to be resolved.

Specifically, an object of the present invention is to provide a method for manufacturing a front electrode for solar cells, capable of minimizing loss caused by a region shielded by a grid electrode and resistance loss by photocurrent which flows along the electrode and thereby improving efficiency of solar cells by forming the front electrode realizing patterns having a large aspect ratio (a ratio of the width of front electrode to its height), as compared to conventional front electrodes. That is, the present invention also provides a method for printing front electrodes with a small width and a considerably large height.

Technical Solution

In accordance with one aspect of the present invention, provided is a method for manufacturing a front electrode for solar cells, including:

(i) filling a paste for forming electrodes in a mold in which a depression pattern corresponding to a pattern of a front electrode is imprinted;

(ii) drying the paste and bringing an adhesive film into contact with the paste to transfer the paste from the mold;

(iii) adding the adhesive film to the semiconductor substrate such that the paste directs toward a semiconductor substrate; and (iv) baking the paste transferred from the adhesive film to form a front electrode on the semiconductor substrate.

Conventional front electrodes are formed by a process using a screen printing method, an offset printing method or the like. The screen printing method is a method in which printing is performed by extruding an ink between a screen mask. This method has a precision level of about 100 µm and thus has a disadvantage of high electrode loss due to the impossibility of realizing patterns of 100 µm or less. In addition, extrusion should be performed using a squeeze and is thus disadvantageous for continuous processes.

In a case where a front electrode is formed using an offset printing method, patterns with a fine size can be easily prepared. This method uses a print roll to transfer the paste to the substrate and thus has advantages of realizing a continuous process in which patterns can be formed by a single transfer process even in a large area using a print roll corresponding to the desired area and of exhibiting considerably high process efficiency.

However, conventional screen printing methods or offset printing methods have a limitation of an increase in a ratio of width to height (that is, aspect ratio) and typically have an aspect ratio of about 0.1 to 0.15. When the aspect ratio of front electrode is low, the width of the front electrode should be increased in order to reduce resistance loss. In this case, light loss (shadow loss) disadvantageously increases. Accordingly, in order to solve these problems, formation of front electrodes having a large aspect ratio is required.

When the depression patterns of molds are deeply formed in order to manufacture front electrodes with a large aspect ratio, disadvantageously, the paste cannot be completely separated (released) from the depression pattern in the process of transferring the paste filled in these depression patterns to the semiconductor substrate. That is, the great depth of the depression pattern causes an interfacial friction force or bond force between the mold and the paste to be higher than bond force between the paste and the semiconductor substrate and makes it impossible to realize complete transfer.

In this regard, Korean Patent Laid-open No. 2008-0050862 filed by the inventors of the present invention discloses a method for forming an electrode for solar cells, including injecting a paste for forming electrodes into a mold, curing the paste to form an electrode line, adhering the electrode line to an adhesive tape coated with an adhesive, adhering the electrode line adhered to the adhesive tape to a substrate using a bond having a stronger bonding strength than the adhesive, separating the adhesive tape from the electrode line, and heating the electrode line formed on the substrate.

However, the present inventors confirmed that, in this method, a part of the electrode line is not separated from the adhesive tape and final electrodes are thus defective in spite of difference in bonding strength between the adhesive and the adhesive tape and between the bond and the substrate (difference between adhesion ability and bonding ability).

On the other hand, according to the present invention, the paste filled in the depression pattern of the mold is transferred using an adhesive film, and the paste can thus be completely separated from the depression pattern of the mold through high bonding force (specifically, adhesive strength) between the paste and the adhesive film in spite of high aspect ratio, and the adhesive film, to which the paste is transferred, is directly transferred to the semiconductor substrate, and defects as mentioned above can thus be prevented. Furthermore, this enables complete manufacture of front electrodes with a large aspect ratio.

Generally, a front electrode for solar cells includes a semiconductor substrate, a plurality of grid electrodes arranged in parallel on the substrate and a current-collecting electrode which crosses the grid electrode.

Accordingly, a depression pattern corresponding to the electrode pattern is imprinted on the surface of the mold used for the manufacturing method of the present invention Materials for the mold that can be used for the present invention may be diversified and are preferably a silicone-based rubber. In a preferred embodiment, the mold may be a polydimethylsiloxane (PDMS) mold.

The PDMS mold is highly flexible and is easily detached or adhered. In particular, the PDMS mold contributes to further complete transfer of the paste with a large aspect ratio from the depression pattern of the mold to the adhesive film. Specifically, the PDMS mold in which the paste is filled in the depression pattern shifts the paste toward the adhesive film when the paste contacts the adhesive film and a pressure is applied thereto. In addition, the PDMS mold is readily released due to flexibility, when it is separated from the adhesive film after transfer of the paste.

This PDMS mold may be produced by a variety of methods and for example, the mold may be produced by adding a PDMS solution to a master mold in which a pattern with a reverse shape to the pattern of the front electrode is imprinted, followed by curing.

The master mold is for example produced by dry or wet-etching the pattern having the reverse shape on a glass substrate, or patterning the pattern using a photoresist.

The patterning method using a photoresist may be carried out by applying a photoresist to a glass substrate, irradiating the photoresist in the form of a pattern using a mask pattern to induce a partial reaction (for example, polymerization reaction), removing a unreacted region, and etching a region, to which the glass substrate is exposed, with a material such as HF.

A PDMS mold is difficult to handle due to high ductility. Accordingly, a PDMS mold, to which a hard film is added, is more preferable than a case where a PDMS mold is used alone.

The film added to the PDMS mold may be diversified and is for example a polyethylene terephthalate (PTE) film. In addition, the mode for adding the film to the PDMS mold may be diversified, and examples thereof include, but are not limited to, adhesion of the film to the rear surface of the mold, embedding of the film in the mold and the like.

In the method for manufacturing the front electrode according to the present invention, the paste comprises materials for grid and current collection electrodes of front electrodes and is preferably an Ag powder. The paste further comprises a binder to provide a bonding force with a predetermined solvent to render flowability. The solvent and binder are known in the art and a detailed description thereof is thus omitted.

When the paste filled in the depression pattern of the mold is not sufficiently dried, a part thereof may remain on the depression pattern of the mold in the process of transferring the adhesive film. Accordingly, it is preferable that the drying time should be sufficient.

In a preferred embodiment, the paste may be a UV curable conductive paste and may be cured by UV irradiation during the drying process. In this case, after the paste is filled in the depression pattern of the mold, the paste can be readily cured only by UV irradiation for 1 to 2 seconds, thus advantageously considerably reducing drying time.

Any adhesive film may be used without particular limitation so long as it allows transfer of the paste from the depression pattern of the mold and transfer of the same to a semiconductor substrate. For example, the adhesive film may have a structure in which an adhesive layer is applied to a film substrate as release paper. Accordingly, the paste is transferred from the depression pattern of the mold using the adhesive layer provided with release paper and is then transferred to the semiconductor substrate, and the release paper is removed before curing. Consequently, the adhesive layer applied to the release paper enables the paste from the depression pattern of the mold to be transferred and the same to be transferred to the semiconductor substrate, and imparts adhesive strength between the paste and the semiconductor substrate.

A region of semiconductor substrate to which the paste is transferred may be an n-type semiconductor layer made of crystalline silicon and may further include various layers, if necessary. For example, an anti-reflection film may be applied to the impurity layer of the $N^+$ semiconductor layer and the anti-reflection film may be silicon nitride or silicon oxide.

When the paste transferred to the semiconductor substrate is baked, a final front electrode is formed. This baking process may for example include pre-drying at a temperature of 150 to 200° C., removing a binder at 400 to 500° C., sintering at 750 to 850° C. and the like. The adhesive film is made of an organic component and the adhesive film transferred together with the paste is degraded and removed during the baking process and only the conductive pattern remains on the semiconductor substrate.

The present invention provides a solar cell including a front electrode manufactured by the method.

The front electrode manufactured by the method according to the present invention has a large aspect ratio (a ratio of height to width) which was not known in the art to date and the aspect ratio may be 0.3 to 1.0. Taking into consideration the fact that the front electrode manufactured by a conventional printing method typically has an aspect ratio of 0.1 to 0.15 which is a considerably high aspect ratio.

The shape of the front electrode of the solar cell according to the present invention may be diversified, in a preferred embodiment, the front electrode has a pattern including a plurality of grid electrodes arranged in parallel and one or more current-collecting electrodes which cross the grid electrodes formed on the semiconductor substrate, wherein current incorporated in the grid electrodes moves to the current-collecting electrode and is collected thereby, and the width of the grid may be 20 to 100 µm. Hereinafter, the structure of the electrode may also be called a "first front electrode".

Conventional grid electrodes cause great electrode loss due to considerably large width of about 120 to about 150 µm and a large region (shadow) shielded by the electrodes.

In this regard, the inventors of the present invention reviewed correlation between electrode loss, and the sizes of grid electrodes and current-collecting electrodes in order to develop structures to minimize electrode loss. As a result, electrode loss can be reduced by adjusting the width of grid electrodes to 20 to 100 µm, particularly preferably, to 60 to 90 µm. That is, the inventors of the present invention confirmed that although shadow loss is similarly controlled, a case where grid electrodes with a small width are arranged by a small distance exhibits low electrode loss and higher efficiency, as compared to a case where grid electrodes with a large width are arranged by a large distance.

Specifically, when the width of grid electrodes is lower than 20 µm, current resistance increases and loss thus increases. When the gap of grid electrodes decreases in order to compensate for this increase, shadow loss disadvantageously increases. In addition, when the width of grid electrodes is larger than 100 µm, shadow loss increases. When the gap of grid electrodes decreases in order to compensate for this increase, loss of the n-type semiconductor layer disadvantageously increases.

In addition, the front electrode according to the present invention uses thin grid electrodes, as compared to conventional electrodes, and causes no increase in shadow loss and leads to decrease in movement distance of current and thus increase in efficiency, although the gap between grid electrodes of about 2.5 to about 3 mm decreases. Accordingly, preferably, the gap between the grid electrodes is 0.5 to 2.2

In addition, the number of grid electrodes having a width of 20 to 100 µm formed in one unit pattern (1×1 cm) is 5 to 20.

The grid electrodes having a predetermined width and gap receive current from the n-type semiconductor layer and transfer the same to the current-collecting electrode and efficiently receive current from a plurality of grid electrodes, and the current-collecting electrodes are perpendicular to the grid electrodes and are arranged on both or one end of a series of grid electrodes.

Meanwhile, current which flows from the loss level of the electrode along the grid electrodes integrally increases in proportion to the length of grid electrodes. The width of grid electrodes is preferably small in an initial stage and the width thereof is large due to resistance in the case of a predetermined length or higher.

In this regard, the present invention provides a front electrode for solar cells in which a pattern including a plurality of grid electrodes arranged in parallel and one or more current-collecting electrodes which cross the grid electrodes formed on the semiconductor substrate, wherein current supplied from the grid electrode moves to the current-collecting electrode and is thus collected thereby, wherein the pattern includes a first pattern part in which the width of grid electrodes is 150 µm or less and a second pattern part in which the width of the grid electrodes is smaller than the width of the grid electrodes of the first pattern part. Hereinafter, this electrode structure may be also referred to as a "second front electrode".

In the case where the front electrode has a composite structure including the first pattern part in which the width of grid electrodes is relatively large and the second pattern part in which the width of grid electrodes is relatively small, it is possible to effectively deal with current which cumulatively increases along the length of grid electrodes and to advantageously minimize loss caused by increased current resistance.

For this purpose, the first pattern part with a predetermined length is preferably formed on the grid electrodes arranged at the side of the current-collecting electrodes in which the amount of current increases. In addition, in terms of efficiency per unit area, the first pattern part is preferably perpendicular to the current-collecting electrode. Meanwhile, preferably, the width of the current-collecting electrode is about 1.5 to about 3 mm and two current-collecting electrodes are spaced by a predetermined distance.

In a preferred embodiment, the second pattern part may have a structure in which two or more grid electrodes are joined to one another. Accordingly, since relatively narrow grid electrodes of the second pattern part are joined and connected to the grid electrodes of the first pattern part, power loss during movement between the first pattern part and the second pattern part can be minimized to a negligible level.

As such, a structure of the second pattern part in which the grid electrodes are joined may be preferably a dendrite electrode to connect ends of grid electrodes of the first pattern part to the ends of grid electrodes of the second pattern part. Such a structure may be referred to as a "dendrite electrode".

The width of grid electrodes in the first pattern part and the second pattern part is controlled in order to minimize shadow loss of grid electrodes and minimize resistance increase due to current accumulation.

At this time, the second pattern part is a region where current is fed and the amount of accumulated current is low. Accordingly, it is preferable that grid electrodes having a relatively small width are formed from a viewpoint of minimizing shadow loss. However, in a case where grid electrodes have an excessively small width, formation of the electrodes is not easy and resistance is disadvantageously generated. In this regard, the width of grid electrodes in the second pattern part is preferably 10 to 60 μm, further preferably 10 to 40 μm.

In addition, the first pattern part is a region where current is discharged to the current-collecting electrode (in some cases, the first pattern part may serve as a region to which current is fed). Accordingly, the first pattern part preferably has a large width to minimize resistance increase due to current accumulation. However, when the width is excessively increased, disadvantageously, shadow loss and material waste may be caused. Thus, the width of grid electrodes in the first pattern part is larger than the width of grid electrodes in the second pattern part and is preferably 50 to 150 μm, more preferably 60 to 100 μm.

In one embodiment, in a case where a dendrite electrode is formed, the width of the dendrite electrode is equivalent to or larger than the width of grid electrodes in the second pattern part and is preferably 10 to 80 μm, more preferably 10 to 50 μm.

Meanwhile, when the distance between the grid electrodes is large, movement distance of current from the n-type semiconductor layer to the grid electrodes increases and current loss is generated and, on the other hand, when the width is excessively small, shadow loss disadvantageously increases.

In terms of these aspects, the gap between the grid electrodes in the second pattern part is 0.5 to 2 mm and the gap between the grid electrodes in the first pattern part is equivalent to or larger than the width of grid electrodes in the second pattern part and may be 1.5 to 3 mm. In addition, the dendrite electrode is inclined at an angle of about 30 to about 70 degrees with respect to a length direction of the grid electrodes.

In addition, the length of the second pattern part is higher than 70%, or the length of the first pattern part is lower than 30%, with respect to the total length of all grid electrodes, current resistance is excessively increased, and when the length of the second pattern part is lower than 10% or the length of the first pattern part is larger than 90%, shadow loss increases.

Accordingly, the length of grid electrodes in the second pattern part is preferably 10 to 70% and the length of grid electrodes in the first pattern part is 30 to 90% with respect to the total length of all grid electrodes. When the length of dendrite electrodes is large, the length of grid electrodes is excessively increased. Preferably, the length is 0 to 10% with respect to the total length of all patterns.

The present invention provides the solar cell described above and the solar cell has an optimized structure of grid electrodes, and thus entails an electrode loss lower than 1.3 mW/cm$^2$, thus advantageously exhibiting considerably superior conversion efficiency.

The solar cell may be a bulky material and is preferably a crystalline silicon solar cell in terms of high efficiency. The overall configuration of the solar cell is well-known in the art and a detailed explanation thereof is thus omitted.

Advantageous Effects

As apparent from the fore-going, the present invention can minimize loss shielded by the front electrode and resistance loss by the photocurrent along the electrode. In addition, the width and shape of grid electrodes in the front electrode are controlled to a predetermined level and structure, to minimize shadow loss and resistance increase and thereby reduce power loss.

As a result, the present invention enables manufacture of solar cells with superior efficiency.

BRIEF DESCRIPTION OF THE DRAWINGS

The above and other objects, features and other advantages of the present invention will be more clearly understood from the following detailed description taken in conjunction with the accompanying drawings, in which.

BEST MODE

Now, the present invention will be described in more detail with reference to the following examples. These examples are provided only for illustrating the present invention and should not be construed as limiting the scope and spirit of the present invention.

Figure 2:
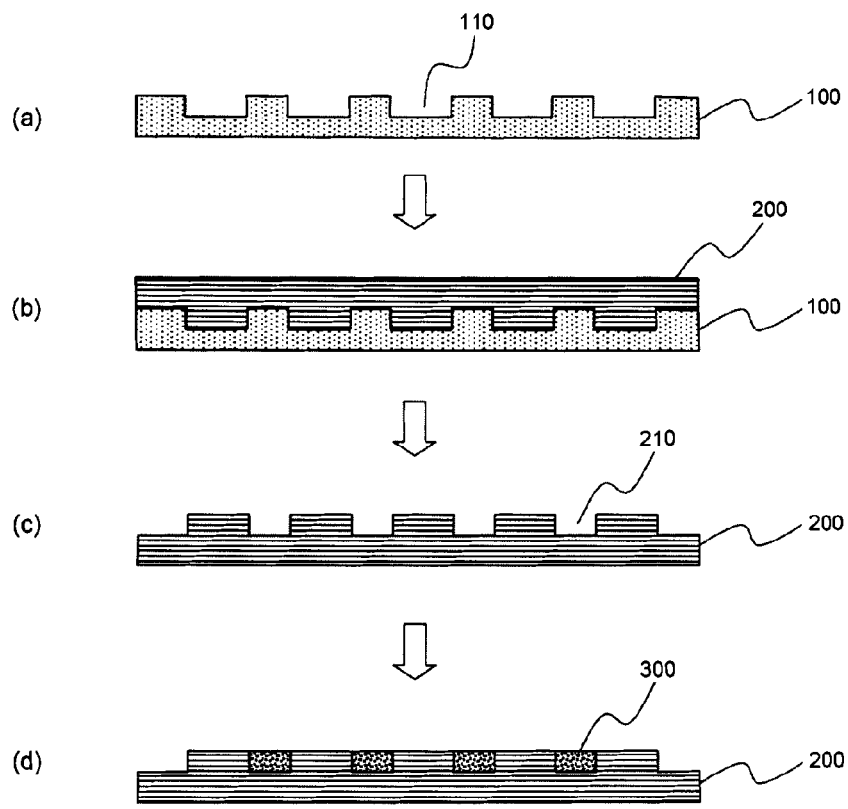
FIGS. 2 to 4 are schematic views illustrating a series of processes for manufacturing a front electrode according to one embodiment of the present invention.
Figure 3:
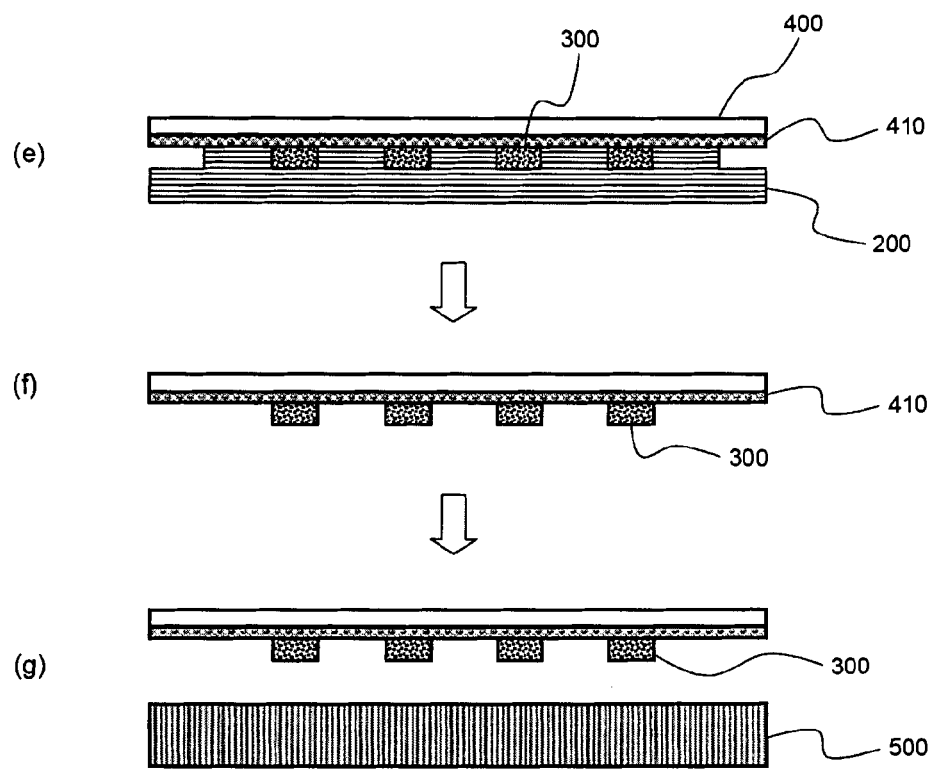
Figure 4:
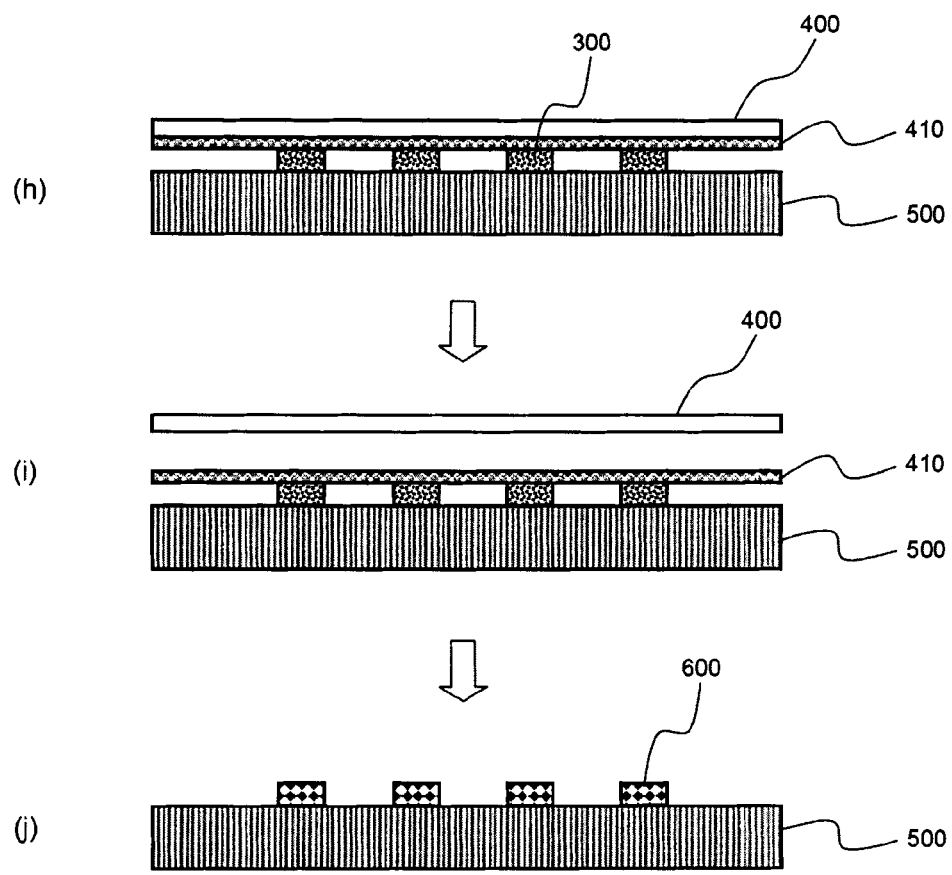

FIGS. 2 to 4 are schematic views illustrating a series of processes for manufacturing a front electrode according to one embodiment of the present invention.

Figure 1:
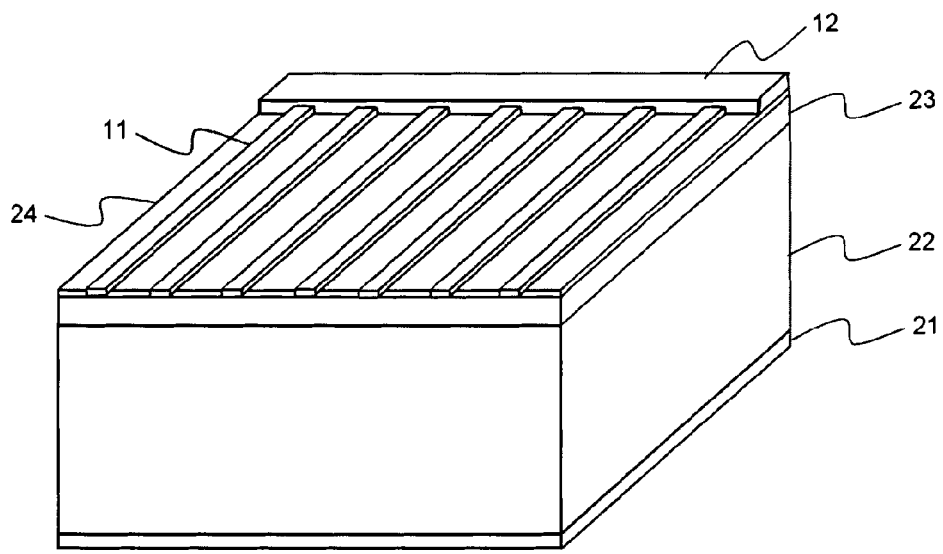
FIG. 1 is a partial perspective view illustrating a solar cell according to the related art.

First, referring to FIG. 1, in process (a), a groove or pattern 110 having a reverse shape to the pattern of a front electrode to be formed is formed on a semiconductor substrate to produce a master mold 100. The master mold 100 may be produced by forming the pattern 110 through dry or wet-etching a glass substrate, or through patterning the substrate using a photoresist.

In process (b), a PDMS solution is added to the pattern 110 of the master mold 100 and then cured. As a result, in process (c), a PDMS mold 310 having a reverse pattern to the pattern of the master mold 100, that is, the PDMS mold 310 having a depression pattern 210 corresponding to the pattern of the front electrode is formed.

In process (d), a paste for forming electrodes 300 is filled in the depression pattern 210 of the PDMS mold 310 and dried for a suitable period of time. When the drying of the paste 300 is insufficient, a part of the paste 320 remains on the depression pattern 210 of the PDMS mold 200. Accordingly, sufficient drying is required.

Then, in process (e) of FIG. 3, an adhesive film in which an adhesive layer 410 is coated on one surface of a release paper 400 as a film substrate is arranged on the PDMS mold 200 such that the adhesive layer 410 is directed towards the paste 300 and the adhesive film is pressurized to transfer the paste 300.

As a result, the adhesive layer 410 is bonded to the paste 300 through bonding strength (adhesive strength), and the adhesive layer 410 provided with the paste 300 is separated from the PDMS mold 200, as shown in process (f). The paste 300 can be completely separated from the PDMS mold 200 through the adhesive strength of the adhesive layer 410, although the paste 300 has a large aspect ratio. In addition, separation of the paste 300 from the PDMS mold 200 can be further facilitated due to ductility of the PDMS mold 200.

In process (g), the adhesive film is arranged on the semiconductor substrate 500 such that it contacts the paste 300 to form the same structure as in the process (h) of FIG. 4.

Then, in process (i), when the release paper 400 of the adhesive film is removed, the paste 300 bonded to the adhesive layer 410 is arranged on the semiconductor substrate 500.

Finally, in process (j), when the resulting structure is sintered, organic components, paste solvent and binder present on the adhesive layer 410, are removed and only conductive inorganic components present on the paste are sintered to form a front electrode 600.

In some cases, additional processes may be further added within the range that essential configuration of the present invention is not impaired and these processes should be construed as within the scope of the present invention.

Figure 5:
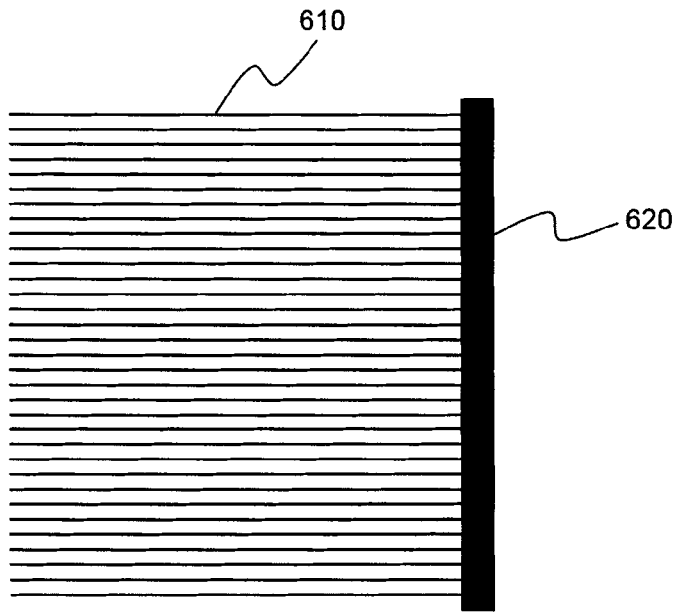
FIG. 5 is a partial top view schematically illustrating a front electrode (first front electrode) according to one embodiment of the present invention.

FIG. 5 is a partial top view schematically illustrating a front electrode (first front electrode) according to one embodiment of the present invention.

Referring to FIG. 5, a front electrode 600 includes a plurality of slim and long grid electrodes 610 and a current-collecting electrode 620 which crosses the grid electrodes 610. In some cases, another current-collecting electrode (not shown) may be arranged opposite to current-collecting electrode 620 such that it crosses the grid electrodes 610. In the front electrode 600 having such a structure, current is supplied from the n-type semiconductor layer arranged under the front electrode 600 to the grid electrode 610 and is transferred to the current-collecting electrode 620 along the grid electrode 610 and to an exterior I/O terminal (not shown).

The width of grid electrodes 610 is 20 to 100 μm and the gap therebetween is 0.5 to 2.2 mm. That is, the grid electrodes are thin and dense, as compared to conventional grid electrodes. Accordingly, shadow loss is minimized, movement distance of current from the n-type semiconductor layer is shortened and loss generated when passing through the n-type semiconductor layer can thus be reduced. Furthermore, as shown in FIG. 4, the grid electrodes have a large aspect ratio and can thus minimize resistance loss.

Figure 6:
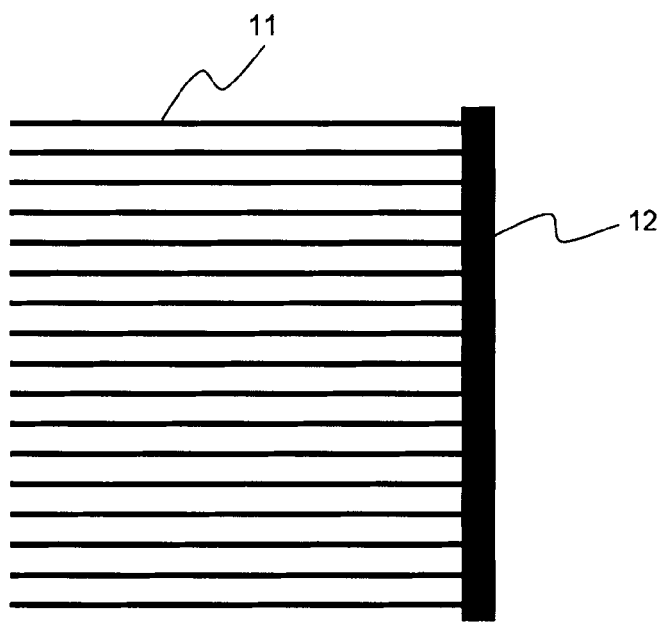
FIG. 6 is a top view of a front electrode illustrating according to the related art.

On the other hand, a top view of a front electrode according to conventional methods is shown in FIG. 6. As can be seen from comparison between FIGS. 5 and 6, the front electrode according to the first embodiment of the present invention (referred to as a "first front electrode") has a structure in which a plurality of grid electrodes having a small width, as compared to conventional front electrodes, are arranged by a small distance.

Figure 7:
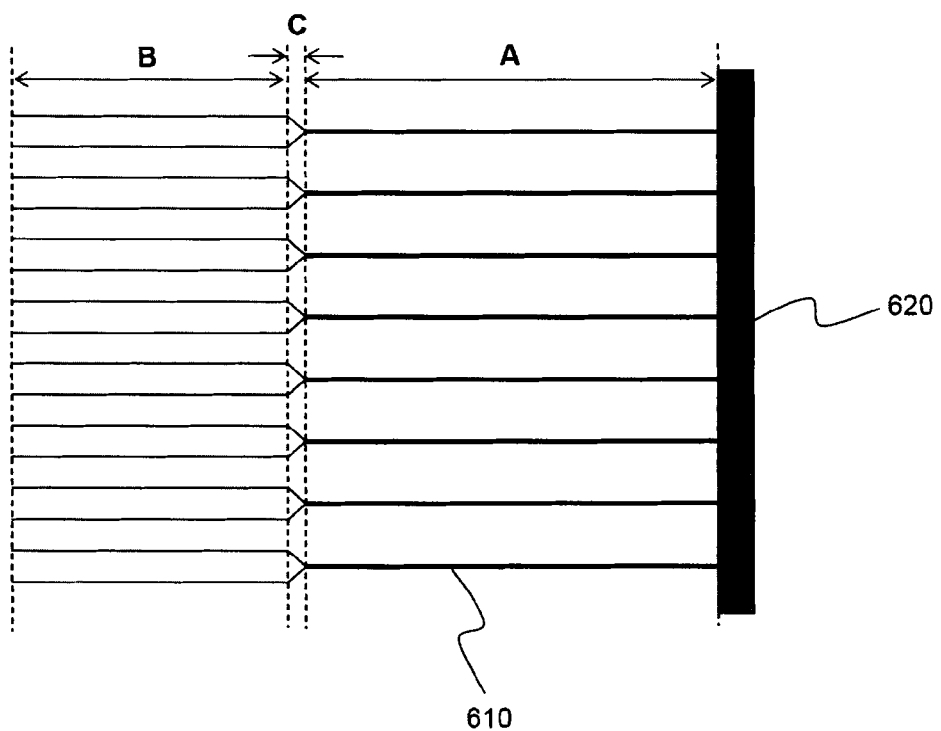
FIGS. 7 and 8 are partial top views schematically illustrating a front electrode (second front electrode) according to one embodiment of the present invention.
Figure 8:
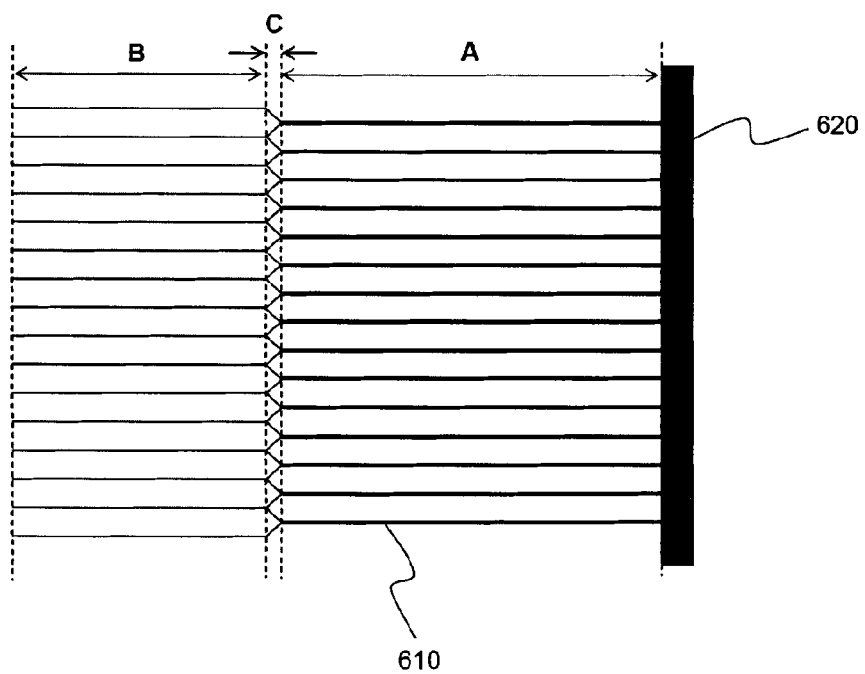

Partial top views of the front electrode according to another embodiment of the present invention (second front electrode) are shown in FIGS. 7 and 8.

Referring to FIGS. 7 and 8, the grid electrode 610 includes a first pattern part (A) arranged at the side of the current-collecting electrode 620, a second pattern part (B) distant from the current-collecting electrode 620, and a dendrite electrode (C) between the first pattern part (A) and the second pattern part (B). Wider grid electrodes are sparsely arranged in the first pattern part (A), while narrower grid electrodes are densely arranged in the second pattern part.

It is possible to maximize the amount of current supplied from the second pattern part (B) due to such a structure and minimize current resistance and shadow loss due to the wider first pattern part (A).

In the front electrode 601 shown in FIG. 7, two grid electrodes of the second pattern part are coupled to each dendrite electrode (C). In the front electrode 602 shown in FIG. 8, all grid electrodes of the second pattern part are coupled to the dendrite electrode (C). In the front electrode 602 shown in FIG. 8, grid electrodes of the first pattern part are relatively narrow. Grid electrodes having a smaller width than the width of grid electrodes in the first pattern part of FIG. 7 can be formed taking into consideration shadow loss.

Figure 9:
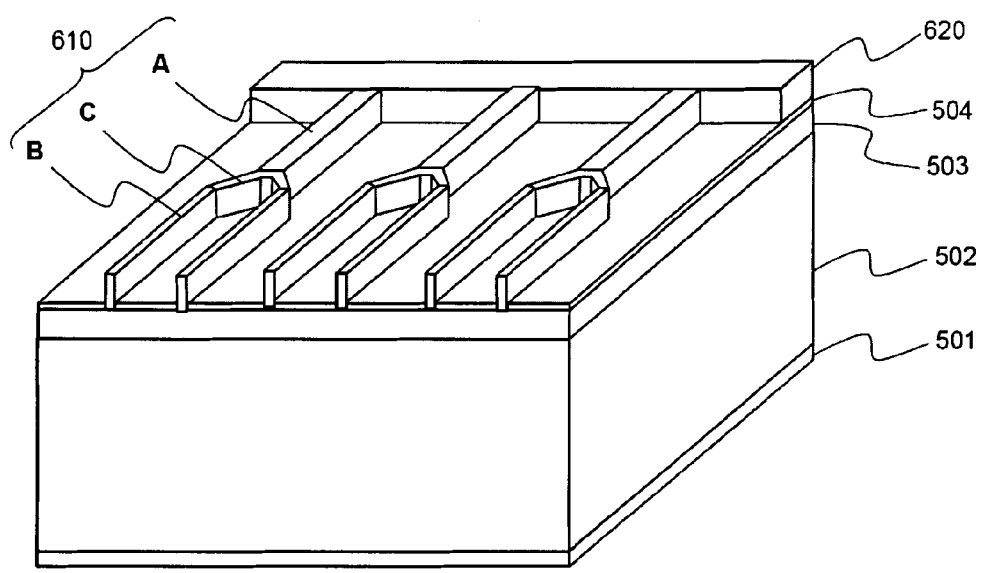
FIG. 9 is a partial perspective view schematically illustrating a solar cell provided with the front electrode of FIG. 7.

FIG. 9 is a partial schematic view illustrating a solar cell provided with a front electrode of FIG. 7.

Referring to FIG. 9, the solar cell includes a p-type semiconductor layer 502, an n-type semiconductor layer 503 having an opposite conductive type to the p-type semiconductor layer 502 arranged on the p-type semiconductor layer 502 and a p/n junction formed at the interface therebetween. A rear electrode 501 is formed under the p-type semiconductor layer 502. An anti-reflection film 504 having a honeycomb structure to hinder light reflection is formed on the n-type semiconductor layer 503 and a front electrode including the grid electrodes and the current-collecting electrode 620 is formed on the anti-reflection film 504 and at least partly contacts the n-type semiconductor layer 503.

The p-type semiconductor layer 502 is generally a p-type silicon substrate and the n-type semiconductor layer 503 is generally a phosphorous (P)-doped n-type emitter layer. In addition, the front electrode 500 is generally in the form of an Ag pattern and a rear electrode 501 is formed as an Al layer on the rear surface of the p-type semiconductor layer 502.

The front electrode is perpendicularly connected to the current-collecting electrode 620 having a large width and includes a first pattern part 610A including grid electrodes having a width of 150 μm or less, a second pattern part 610B including grid electrodes having a width smaller than those of the first pattern part 610A, and a dendrite electrode 610C including grid electrodes which contacts and connects these pattern parts.

Based on this structure, increase in resistance can be minimized through the first pattern part A, since current supplied from the n-type semiconductor layer 503 to the second pattern part B moves and is accumulated along the grid electrode 610, and shadow loss is minimized and overall power loss can thus be minimized, since the gap between the first pattern parts 610A is large and the gap between the second pattern part 610B is small.

Figure 10:
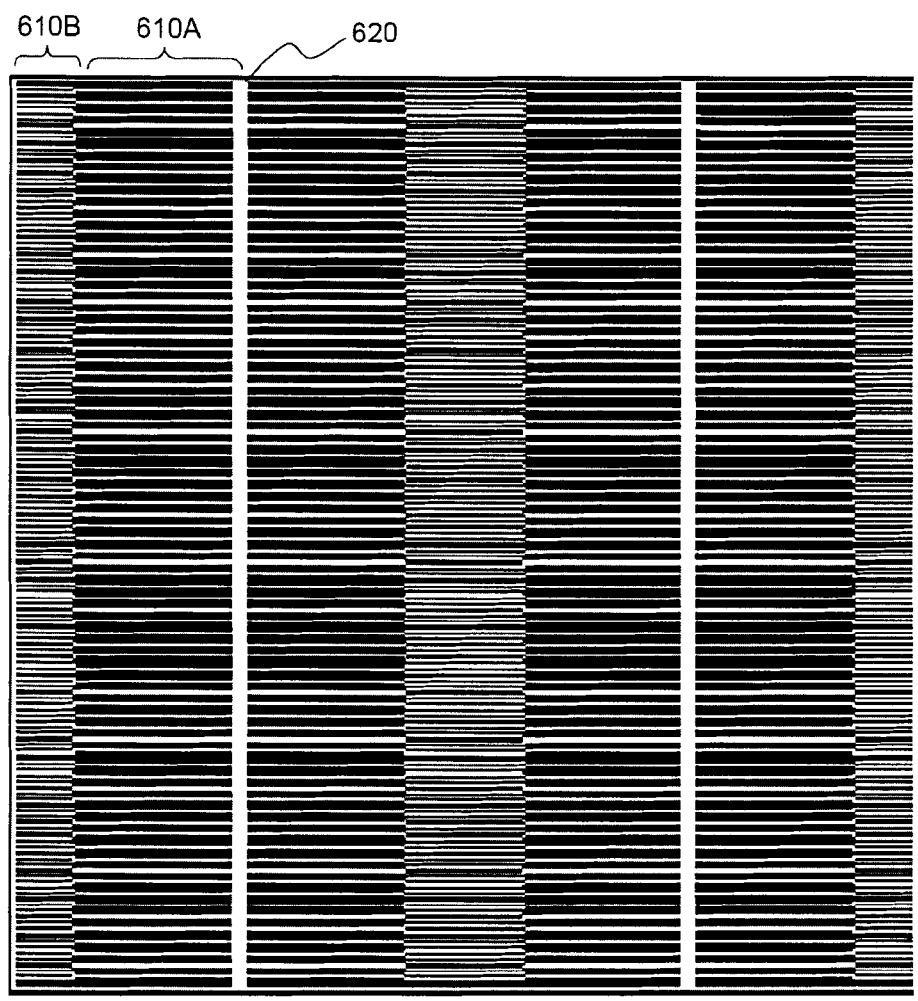
FIG. 10 is a front top view schematically illustrating a front electrode of the solar cell according to one embodiment of the present invention.

FIG. 10 is a front top view schematically illustrating a front electrode of the solar cell.

Referring to FIG. 10, the front electrode includes two current-collecting electrodes 620 and grid electrodes perpendicular to the current-collecting electrodes 620, arranged between the current-collecting electrodes 620. At this time, the first pattern part 610A having a large thickness is connected to the current-collecting electrode 620 and is perpendicular thereto. In addition, the second pattern part 610B is connected to the first pattern part 610A and the second and first pattern parts are connected to each other through the center between the two current-collecting electrodes 620.

[Industrial Applicability]

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method for manufacturing a front electrode for solar cells comprising:
    filling a paste for forming electrodes in a mold in which a depression pattern corresponding to a pattern of a front electrode is imprinted;
    drying the paste and bringing an adhesive film into contact with the paste to transfer the paste from the mold;
    adding the adhesive film to a semiconductor substrate such that the paste is directed toward the semiconductor substrate; and
    directly transferring the adhesive film to the semiconductor substrate, and then baking the paste to form a front electrode on the semiconductor substrate.

2. The method according to claim 1, wherein the mold is made of a silicone rubber.

3. The method according to claim 2, wherein the mold is a polydimethylsiloxane (PDMS) mold.

4. The method according to claim 3, wherein the PDMS mold is produced by adding a PDMS solution to a master mold in which a pattern with a reverse shape to the pattern of the front electrode is imprinted, followed by curing.

5. The method according to claim 4, wherein the master mold is produced by dry- or wet-etching the pattern having the reverse shape on a glass substrate, or patterning the pattern using a photoresist.

6. The method according to claim 3, wherein a PET film is added to the PDMS mold.

7. The method according to claim 1, wherein the paste contains an Ag powder.

8. The method according to claim 1, wherein the paste is a UV curable conductive paste and is cured by UV irradiation during the drying process.

9. The method according to claim 1, wherein the adhesive film has a structure in which an adhesive layer is applied to a film substrate as release paper and the release paper is removed before the paste is transferred to the semiconductor substrate and then baked.

10. The method according to claim 1, wherein a region of the semiconductor substrate to which the paste is transferred is an n-type semiconductor layer made of crystalline silicon.

* * * * *